United States Patent [19]

Edwards

[11] 4,216,458
[45] Aug. 5, 1980

[54] SOLID STATE SWITCH

[75] Inventor: Jon L. Edwards, Houston, Tex.

[73] Assignee: Texas Instruments Incorporated, Dallas, Tex.

[21] Appl. No.: 921,306

[22] Filed: Jul. 3, 1978

[51] Int. Cl.² ............................................. H01L 43/04
[52] U.S. Cl. ................................. 338/32 H; 323/94 H
[58] Field of Search ............................ 338/32 H, 32 R; 323/94 H; 324/251, 252; 335/296, 302, 303

[56] References Cited
U.S. PATENT DOCUMENTS

| | | | |
|---|---|---|---|
| 3,139,600 | 6/1964 | Rasmanis et al. | 338/32 H |
| 3,703,695 | 11/1972 | Mogi | 338/32 R |
| 3,845,445 | 10/1974 | Braun et al. | 338/32 H |
| 3,988,710 | 10/1976 | Sidor et al. | 323/94 H X |

*Primary Examiner*—C. L. Albritton
*Attorney, Agent, or Firm*—Thomas G. Devine; Leo N. Heiting; Mel Sharp

[57] ABSTRACT

A switch assembly with reduced number of mechanical parts in conjunction with an improved Hall Effect generator provides a more reliable, longer life switch. In one embodiment, the rocking motion of a rocker member is translated into linear motion to move a magnet relative to the Hall Effect generator. As the rocker member is rotated by pressure applied to the higher of its actuation surfaces, rotation is set up about a pivot point, causing the rocker member to shift the magnet to the opposite side of the base of the rocker assembly. This shift of the magnet changes the magnetic field to which the Hall Effect generator is exposed from one magnetic polarity to an opposite magnetic polarity which causes a respective change in output voltage of the Hall Effect generator from a first predetermined voltage to a second predetermined voltage. An audible "snap" is generated by the magnet when it contacts the side of the base.

22 Claims, 7 Drawing Figures

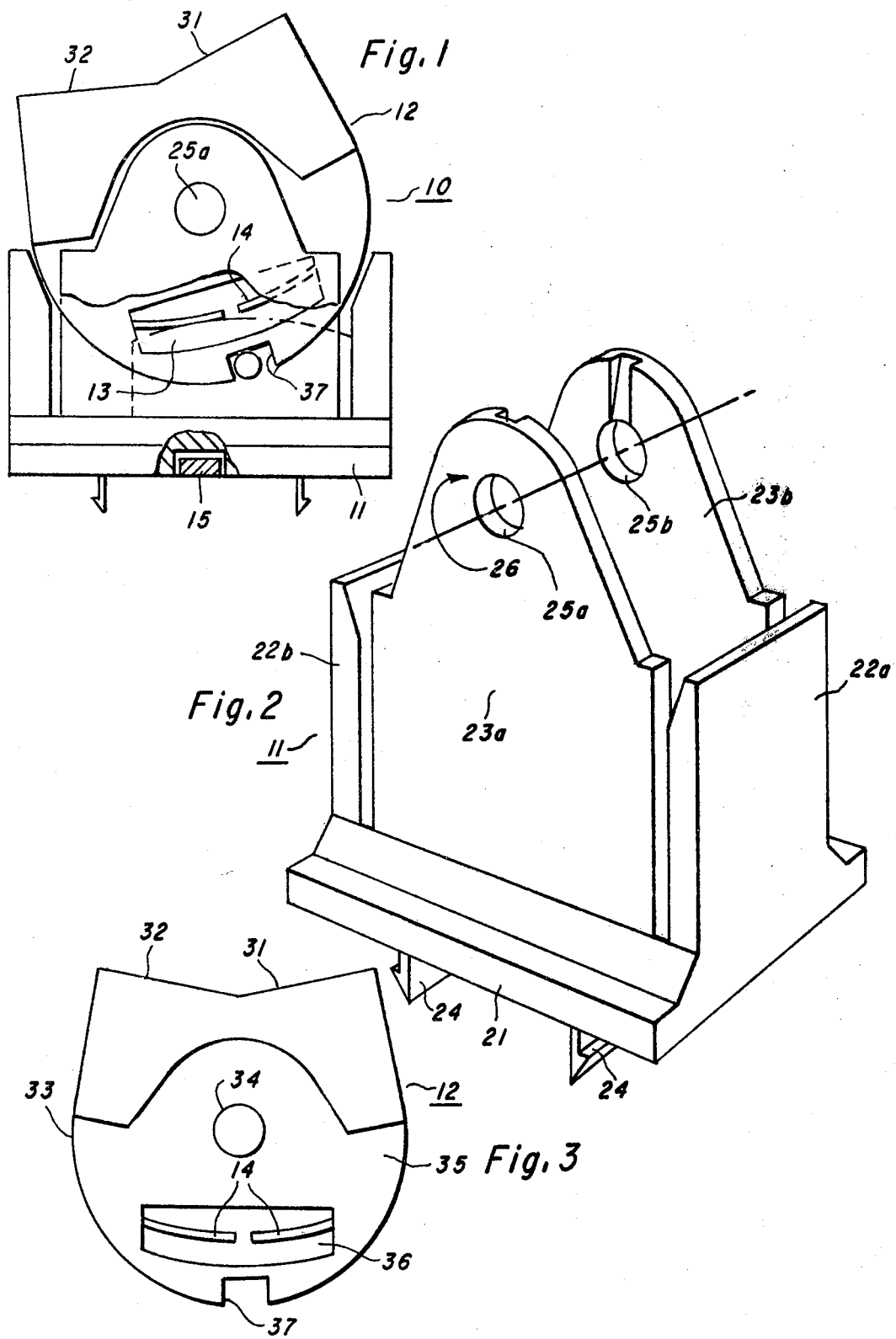

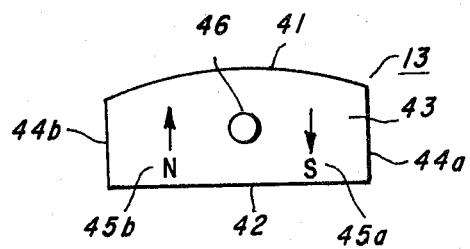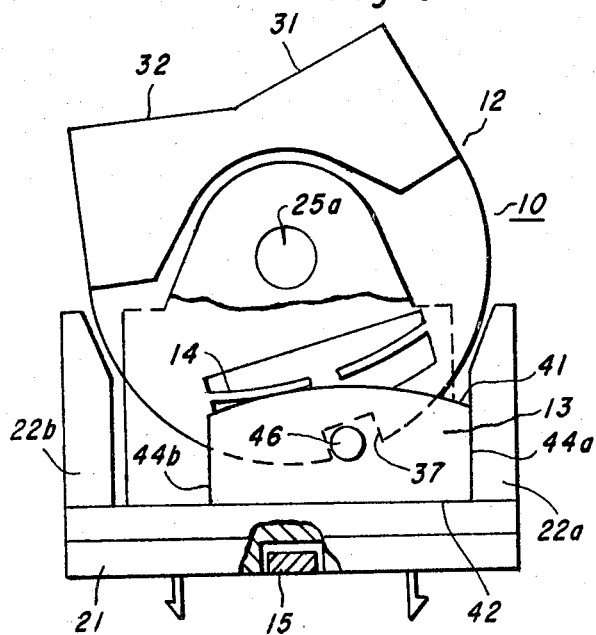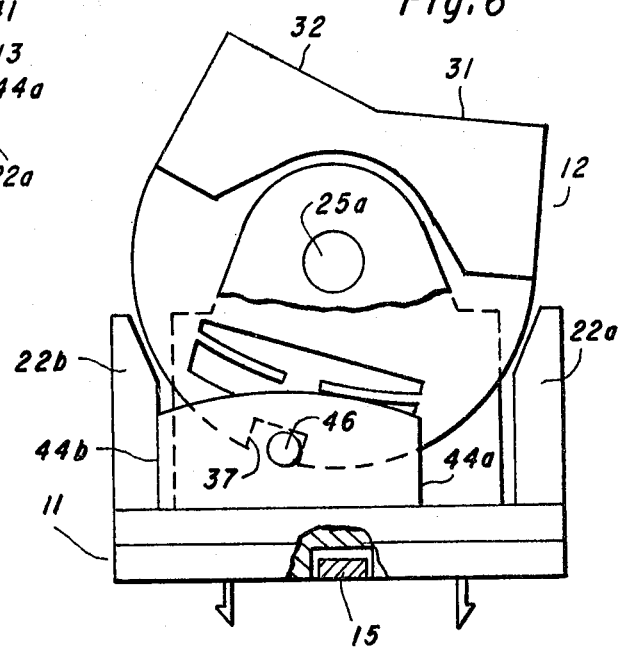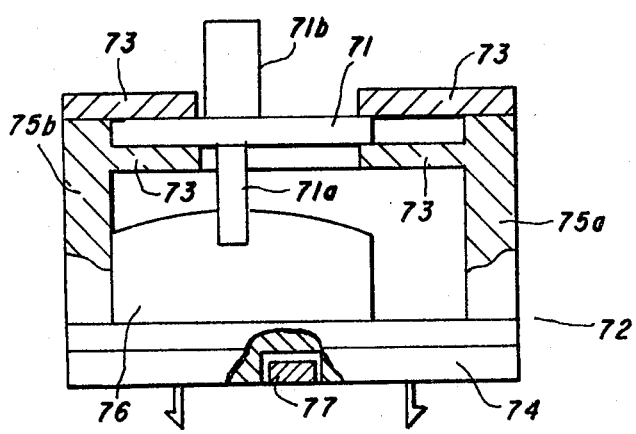

SOLID STATE SWITCH

BACKGROUND OF THE INVENTION

This invention relates to switches and in particular to solid state switches. Heretofore, Hall Effect generators have been used primarily as keyswitches for keyboards and the like. Such keyswitches are manually depressed and released, resulting in rectilinear movement thereof. The movement of the keys changes the magnetic field to which a Hall Effect generator is exposed, thus causing a change in the generator output voltage.

One such keyboard is taught by Dalmasso (U.S. Pat. No. 3,611,358). Attached to and supported by each key stem is a magnet which moves with the key in rectilinear fashion relative to a stationary Hall Effect generator which senses a change in the intensity of the magnetic flux. A similar keyboard is described by Maupin et al (U.S. Pat. No. 3,596,114) in which keyswitch moves a magnet supported thereby in rectilinear fashion relative to a stationary Hall Effect generator.

Other related references are Turja (U.S. Pat. No. 3,449,517) which shows a Hall Effect generator moved relative to a stationary magnet, and Semmelman (U.S. Pat. No. 2,774,890) which shows the input and output terminals of a Hall Effect generator asymmetrically positioned.

In each of the above prior art keyboards, manual pressure must be maintained to hold the keyswitch in a depressed or actuated position, and when such pressure is removed, the switch returns to an "unactuated" position. These keyswitches are not suitable for use when it is desired that the switch remain in either position desired after manual pressure has been removed.

Heretofore, switches such as rocker action or slide switches have been mechanical in nature. An electrical circuit is completed by closure of mechanical contacts which, in turn, produce electrical "bounce" in the circuitry. This "bounce" must be eliminated if sensitive components are to be used elsewhere in the circuitry.

Another disadvantage of mechanical action switches is their limited life ratings (maximum 100,000 actuations). The complex mechanical design (typically 12 or more mechanical parts for rocker action switches) and contact resistance from oxide and nitride buildup are largely responsible for this limited lifetime. Furthermore, mechanical action switches must be connected to the electrical circuitry by soldering, wire wrap or other mechanical techniques.

It is therefore an object of the present invention to provide an improved solid state switch.

It is another object of the invention to provide a solid state switch which can remain activated without applying external force.

It is another object of the invention to provide an improved, more reliable, easier to assemble and longer lasting switch with fewer mechanical parts than prior mechanical action switches.

It is a further object of the invention to provide an improved switch that can be quickly and easily attached to a printed circuit board.

BRIEF DESCRIPTION OF THE INVENTION

These and other objects are accomplished in accordance with the present invention by a switch assembly having few mechanical parts included a slideable magnet in combination with a Hall Effect generator. The switch assembly is comprised of a base, a permanent magnet having magnetic poles of opposite polarity on opposite ends thereof and a Hall Effect generator mounted in fixed position with respect to the base. An actuator means is coupled to the magnet and moveably mounted with respect to the base for sliding the magnet across the base relative to the Hall Effect generator. The Hall Effect generator is responsive to the relative position of the magnet for generating an electric current in accordance therewith.

In one preferred embodiment, a rocker action switch assembly has a base with a rectangular bottom surface and four side surfaces and two or more clips on the bottom surface to attach the base to a printed circuit board. Mounted pivotally to the base at opposite points on two parallel side surfaces is a rocker member. The rocker member has first and second actuation surfaces, one of which extends farther outward from the base than the other as dictated by the position of the switch. Positioned within the perimeter of the base with its lower major surface in contact with the bottom surface of the base is a permanent magnet. This magnet is coupled to the lower portion of the rocker member. A leaf-type spring member, affixed to the rocker member, applies downward pressure on the upper major surface of the magnet and enhances the "snap" action of the switch.

The Hall Effect generator utilized in a preferred embodiment is an improved type in which offset voltage has been substantially eliminated. This improved Hall Effect generator is the subject of copending patent application Ser. No. 764,931, filed Feb. 2, 1977, by Robert Bate et al.

When downward pressure is applied to the higher of the actuation surfaces of the rocker member, the rocker member rotates about the pivot points on the sides of the base. This rocking motion is translated to linear motion of the magnet, which slides across the bottom of the base to the opposite side. Further pressure is not required to keep the rocker member and magnet in a fixed position.

The Hall Effect generator is positioned directly below the center of the base and is connected to a printed circuit board. The magnet has magnetic poles of opposite polarity on opposite ends thereof so that it exposes the Hall Effect generator to a reversal in the direction of the magnetic field perpendicular to the plane of the generator each time the magnet travels across the base. This reversal of the magnetic field causes a corresponding change in the output of the Hall Effect generator from one predetermined voltage to a second predetermined voltage.

In another embodiment, the leaf-type spring member may be omitted and the required switching action still obtained.

In still other embodiments, the assembly may comprise a slide, toggle, alternate action (shiftlock), rotary or multiple position switch.

BRIEF DESCRIPTION OF THE DRAWINGS

Still further objects and advantages of the invention will be apparent from the detailed description and claims when read in conjunction with the accompanying drawings wherein:

FIG. 1 is a front elevational view of a solid state rocker action switch embodying the present invention;

FIG. 2 is a perspective view of the base of the solid state rocker action switch;

FIG. 3 is a front elevational view of the rocker member and leaf-type spring member of the solid state rocker action switch;

FIG. 4 is a side elevational view of the magnet;

FIG. 5 is a front elevational view of the rocker member, leaf-type spring member and magnet within the base with the front side of the base removed;

FIG. 6 is a front elevational view, as in FIG. 5, with the rocker member rotated to a switch position opposite from that in FIG. 5; and FIG. 7 is a front elevational view of a solid state slide action switch embodying the present invention with the front side of the base removed.

DETAILED DESCRIPTION OF THE INVENTION

A solid state rocker action switch embodying the present invention is illustrated in FIG. 1. Referring to FIG. 1, the rocker action switch assembly 10 includes four components: base 11, rocker member 12, permanent magnet 13 and leaf-type spring member 14. Located directly beneath base 11 is Hall Effect generator 15, which is electrically connectable to a printed circuit board.

Referring to FIG. 2, base 11 is comprised of an insulating material such as plastic with rectangular bottom surface 21 and four side wall members 22a, 22b, 23a and 23b. Side wall members 22a and 22b are rectangular and mutually parallel. Side wall members 23a and 23b, which are also mutually parallel, include a rectangular portion and a curved extension portion, and are of greater height than side wall members 22a and 22b. Clip members 24 are provided for attachment to a printed circuit board (not shown). Rocker member 12 is pivotally mounted to base 11 at pivot points 25a and 25b on side wall members 23a and 23b, and hence, rocker member 12 is partially rotatable about an axis 26 between pivot points 25a and 25b.

Referring to FIG. 3, rocker member 12 is comprised of an insulating material such as plastic and includes two flat opposite major surfaces 35, first and second actuation surfaces 31 and 32, respectively, and curved surface 33. One actuation surface is always extended farther out from base 11 than the other, dependent upon the position or state of the switch. First actuation surface 31 is shown in FIG. 1 in the position in which it is farther extended from base 11 than second actuation surface 32. An axle projection 34 is provided on each major surface 35 of rocker member 12; projections 34 extend into openings of pivot points 25a and 25b, thereby pivotally mounting rocker member 12 with respect to base 11. Leaf-type spring member 14 is affixed to rocker member 12 within opening 36 provided therefor. Slots 37, located along curved surface 33, are provided to couple rocker member 12 to magnet 13.

Referring to FIG. 4, magnet 13, used in a preferred embodiment, is comprised of injection molded barium ferrite with a curved major surface 41, flat major surface 42, two side surfaces 43 and two end surfaces 44a and 44b. Magnet 13 is precharged to give it a preselected magnetic field with magnetic poles 45a and 45b of opposite polarity at opposite ends thereof. Looking at FIGS. 4 and 5, magnet 13 includes projection members 46 extending outwardly of side surface 43; projection members 46 are engaged with slots 37 of rocker member 12 to couple magnet 13 to rocker member 12.

Referring to FIG. 5, magnet 13 is positioned within the perimeter of base 11, supported by bottom surface 21. End 44a of magnet 13 is in contact with the inner surface of rectangular side wall member 22a of base 11 in a first predetermined position. To change the state of the switch (e.g., from "off" to "on" or "on" to "off"), downward pressure is applied to the actuation surface which extends to farther outward from base 11 (e.g., first actuation surface 31 in FIG. 5). This force causes rocker member 12 to rotate about pivot points 25a and 25b. The rotation of rocker member 12 is translated into linear motion of magnet 13, which is coupled to rocker member 12 via projection members 46. Magnet 13 slides across bottom surface 21 until the opposite end 44b of magnet 13 contacts the inner surface of opposite rectangular side wall member 22b. When end 44b contacts the surface of side wall member 22b, an audible "snap" is produced. Leaf-type spring member 14 applies downward pressure on curved major surfaces 41 of magnet 13 and enhances the "snap" action. As shown in FIG. 6, after rocker member 12 is rotated and magnet 13 is shifted to opposite side wall 22b of base 11, second actuation surface 32 extends further outward from base 11 and the switch is in a state opposite from that of FIG. 5. No external force need be applied to rocker member 12 for rocker member 12 and magnet 13 to remain in a fixed position.

The use of barium ferrite allows more accurate control of magnet dimensions (and consequently, the resultant magnetic field) than is attainable with other types of magnets. Because of its abrasiveness, barium ferrite tends to cause excessive wear in materials which come in contact with it. In one embodiment, the injection molded barium ferrite magnet 13 has nylon mixed in with the barium ferrite to further reduce the abrasiveness of the magnet surface. The wear problem has been further alleviated in accordance with a feature of the present invention by having the surfaces of base 11 which come in contact with magnet 13 comprised of teflon.

Referring now to FIGS. 5 and 6, Hall Effect generator 15 is positioned directly beneath the center of base 11, and may be mounted to a printed circuit board. In a preferred embodiment, Hall Effect generator 15 is of an improved type in which offset voltage is substantially eliminated. The improved Hall Effect generator has at least two plates located on a semiconductor body, the plates being positioned with respect to one another such that a line bisecting the current contacts of one plate is substantially orthogonal to a line bisecting the current contacts of the other plate. Further details regarding this improved Hall Effect generator are found in copending patent application Ser. No. 764,931, filed Feb. 2, 1977, by Robert Bate et al, which application is assigned to the assignee of the present invention and is incorporated herein by reference.

As previously mentioned, magnet 13 has magnetic poles of opposite polarity on opposite ends thereof. As the position of magnet 13 is changed relative to Hall effect generator 15, generator 15 is exposed to a reversal in the direction of the magnetic lines of flux perpendicular to the plane of generator 15. When the switch is in a particular state, (e.g., "on" or "off"), magnet 13 is positioned against one side of base 11, corresponding to one state of the switch. In FIG. 5, end 44a is in contact with the inner surface of side wall member 22a. Hall Effect generator 15 is thus exposed to the magnetic polarity (45b in FIG. 4) at end 44b of magnet 13 and the output of the generator is a first predetermined voltage. When rocker member 12 rotates and shifts magnet 13 to opposite side wall member 22b of base 11, Hall Effect generator 15 is exposed to an opposite magnetic polarity at opposite end 44a of magnet 13. (See FIG. 6). The output of generator 15 thereby changes to a second predetermined voltage. Thus, a switching effect in the output circuit is obtained.

Because electrical "bounce" has been eliminated in the switch of the present invention, Hall Effect generator 15 can be connected directly to logic, etc., circuitry on a printed circuit board without the need for debounce circuitry. The solid state rocker action switch described above provides a more reliable and longer lasting rocker action switch. It has fewer mechanical parts, only four as compared to twelve or more generally required for mechanical rocker action switches. In another embodiment, leaf-type spring member 14 may be omitted and the required switching action still obtained. Omission of the leaf-type spring member 14, which enhances the "snap" action, reduces the number of mechanical parts to three.

FIG. 7 illustrates another embodiment of the present invention which includes a slide member 71 comprised of an insulating material such as plastic rather than a rocker member. Base 72 has rectangular bottom surface 74 and four rectangular side wall members. Parallel side wall members 75a and 75b are shown in FIG. 7. Slide member 71 is retained by retaining walls 73 and slides back and forth along an axis between the surfaces of side wall members 75a and 75b. Slide member 71 includes members 71a which extend to permanent magnet 76 located within the perimeter of base 72. Members 71a extend perpendicular to the bottom surface of slide member 71, and couple to respective opposite sides of magnet 76 in a manner similar to the coupling of the magnet and rocker member described in the previous embodiment. Slide member 71 includes an actuation member 71b extending outwardly of retaining walls 73. Movement of slide member 71 by means of actuation member 71b along an axis between side surfaces 75a and 75b causes magnet 76 to move back and forth along the same axis from one side of base 72 to the opposite side. The shifting of magnet 76 relative to a Hall Effect generator 77 positioned beneath base 72 exposes generator 77 to a reversal in the direction of the magnetic field perpendicular to the plane of generator 77. Thus, switching action is effected in a similar manner as previously described with respect to the rocker action switch.

In further embodiments, the rocker member may include a projection rather than activation surfaces to provide a toggle-type switch. It is also contemplated that alternate action (shiftlock), rotary and multiple position switches, in which a magnet is moved relative to a Hall Effect generator, can be provided according to the present invention to obtain solid state switching action. A plurality of Hall Effect generators may be used with rotary and multiple position switch assemblies to provide the required switching action when a magnet, having a multiple magnetic pole arrangement, is moved relative to the Hall Effect generators.

Various embodiments of the present invention have been described. Since it is obvious that many additional changes and modifications can be made in the above-described details without departing from the nature and spirit of the invention, it is understood that the invention is not to be limited to said details except as set forth in the appended Claims.

What is claimed is:

1. A solid state switch comprising:
   (a) a base;
   (b) a permanent magnet having magnetic poles of opposite polarity on opposite ends thereof;
   (c) a Hall Effect generator mounted in fixed position with respect to said base and having output terminal means; and
   (d) a rocker member having at least one actuation surfaces, said rocker member being pivotally mounted with respect to said base and mechanically coupled to said magnet, said rocker member being at least partially rotatable in response to downward pressure on said actuation surfaces for sliding said magnet laterally across said base relative to said Hall Effect generator, said Hall Effect generator being responsive to the relative position of said permanent magnet for generating an electric current at said output terminal means in accordance with said relative position.

2. The switch according to claim 1 wherein said base has a bottom surface and a plurality of side wall members extending perpendicularly from said bottom surface, said bottom surface and side wall members forming a guide channel for said magnet.

3. The switch according to claim 2 wherein said bottom surface is rectangular, and four side wall members extend perpendicularly from said bottom surface.

4. The switch according to claim 2 wherein the portions of said bottom surface and said side wall members which contact said magnet are comprised of teflon.

5. The switch according to claim 2 wherein said magnet is located within the perimeter of said base.

6. The switch according to claim 2 wherein said magnet is in contact with the bottom surface of said base.

7. The switch according to claim 2 wherein said magnet moves from one side of said base to the opposite side of said base and contacts at least one of said side wall members after each actuation of said rocker member.

8. A solid state rocker action switch comprising:
   (a) a base having a bottom surface and a plurality of side wall members around the perimeter of said bottom surface extending upward from said bottom surface;
   (b) a permanent magnet having first and second major surfaces and having magnetic poles of opposite polarity on opposite ends thereof, located within the perimeter of said base and supported from below by said bottom surface in contact with said second major surface, said first major surface being curved;
   (c) a Hall Effect generator mounted in fixed position with respect to said base and having output terminal means;
   (d) a rocker member having at least one actuation surfaces, said rocker member pivotally mounted with respect to said base and mechanically coupled to said magnet, said rocker member being rotatable in response to downward pressure on said actuation surfaces and sliding said magnet laterally across said base relative to the Hall Effect generator, said Hall Effect generator being responsive to the relative position of said permanent magnet for generating an electric current at said output terminal means in accordance with said relative position; said
   (e) a curved leaf spring member affixed to said rocker member, said leaf spring member having an outwardly curving major surface in contact with the first major surface of said magnet, said leaf spring member applying biasing pressure against said magnet.

9. The switch according to claim 8 wherein said base has a means for coupling said base to a printed circuit board.

10. The switch according to claim 9 wherein said coupling means comprises a plurality of clip members for snap-on attachment of said base to said printed circuit board.

11. The switch according to claim 8 wherein the portions of said bottom surfaces and said side wall members which contact said magnet are comprised of teflon.

12. The switch according to claim 8 wherein said bottom surface is rectangular and four side wall members extend perpendicularly from said bottom surface.

13. The switch according to claim 8 wherein said permanent magnet is comprised of barium ferrite.

14. The switch according to claim 8 wherein said permanent magnet is comprised of barium ferrite and nylon.

15. The switch according to claim 8 wherein said magnet moves from one side of said base to the opposite side of said base and contacts at least one of said side wall members after each actuation of said rocker member.

16. The switch according to claim 8 wherein said rocker member has a first and second actuation surface, one of which extends farther outward from said base than the other in accordance with the position of said switch, said rocker member being rotatable in response to downward pressure on the actuation surface which extends farther outward from said base.

17. A method for providing solid state switching by generating an output voltage in a Hall Effect generator, which comprises the following steps:
(a) pivotally mounting a rocker member having at least one actuation surfaces to a base so that said rocker member is at least partially rotatable in response to downward pressure on said actuation surfaces;
(b) mechanically coupling said rocker member to a permanent magnet having magnetic poles of opposite polarity on opposite ends thereof so that said magnet slides in response to the rotation of said rocker member;
(c) positioning a Hall Effect generator, having output terminal means, in fixed relation to said base so that it generates an electric current at said output terminal means in accordance with said relative position; whereby
(d) applying downward pressure on said rocker member causes said rocker member to rotate and slide said permanent magnet laterally across said base relative to said Hall Effect generator.

18. A solid state switch comprising:
(a) a base having a bottom surface;
(b) a plurality of clip members extending from said base for snap-on attachment to a printed circuit board;
(c) a permanent magnet having a major surface and magnetic poles of opposite polarity at opposite ends thereof, said magnet being located within the perimeter of said base and being supported from below by said bottom surface in contact with said major surface;
(d) a Hall Effect generator mounted in fixed position with respect to said base and having output terminal means; and
(e) actuator means moveably mounted with respect to said base and mechanically coupled to said magnet for sliding said magnet laterally across said base relative to said Hall Effect generator from a first predetermined position to a second predetermined position and from said second predetermined position to said first predetermined position, said magnet and said actuator means remaining in said first and second predetermined positions without continued application of external force to said actuator means, said Hall Effect generator being responsive to the relative position of said permanent magnet for generating a predetermined electric current at said output terminal means in accordance therewith.

19. A solid state switch comprising:
(a) a base having a bottom surface;
(b) a plurality of clip members extending from said base for snap-on attachment to a printed circuit board;
(c) a permanent magnet having a major surface and magnetic poles of opposite polarity at opposite ends thereof, said magnet located within the perimeter of said base and supported from below by said bottom surface in contact with said major surface;
(d) a Hall Effect generator mounted in fixed position with respect to said base and having output terminal means; and
(e) a slide member having an actuation member, said slide member being moveably mounted with respect to said base in response to a force applied to said actuation member, said slide member being coupled to said magnet for sliding said magnet laterally across said base relative to said Hall Effect generator from a first predetermined position to a second predetermined position and from said second predetermined position to said first predetermined position, said magnet and said slide member remaining in said first and second predetermined positions without continued application of external force to said actuation member, said Hall Effect generator being responsive to the relative position of said permanent magnet for generating a predetermined electric current at said output terminal means in accordance therewith.

20. The switch according to claim 19 wherein said base has a plurality of side wall members around the perimeter of said base and a plurality of retaining walls to support said slide member.

21. The switch according to claim 20 wherein said bottom surface is rectangular and four side wall members extend perpendicularly from said bottom surface.

22. The switch according to claim 20 wherein said magnet moves from one side of said base to the opposite side of said base and contacts at least one of said side wall members after each actuation of said slide member.

* * * * *